United States Patent [19]

Paterson

[11] Patent Number: 5,390,077
[45] Date of Patent: Feb. 14, 1995

[54] INTEGRATED CIRCUIT COOLING DEVICE HAVING INTERNAL BAFFLE

[75] Inventor: Robert W. Paterson, Seneca, S.C.

[73] Assignee: AT&T Global Information Solutions Company, Dayton, Ohio

[21] Appl. No.: 274,937

[22] Filed: Jul. 14, 1994

[51] Int. Cl.⁶ .............................................. H05K 7/20
[52] U.S. Cl. ...................... 361/700; 165/80.3; 165/80.4; 165/104.33; 174/15.2; 257/716; 361/690; 361/699; 29/890.032; 29/890.03
[58] Field of Search .............. 29/890,032, 890.03; 165/80.3, 80.4, 104.21, 104.23, 104.26, 104.29, 104.33; 174/15.1, 15.2; 257/714–716; 361/698–701, 714–722

[56] References Cited

U.S. PATENT DOCUMENTS

| | | | |
|---|---|---|---|
| 4,519,447 | 5/1985 | Wiech, Jr. | 165/104.33 |
| 4,572,286 | 2/1986 | Fujii et al. | 165/104.29 |
| 4,653,579 | 3/1987 | Fujii et al. | 165/104.29 |
| 4,698,728 | 10/1987 | Tustaniwskyj et al. | 361/385 |
| 4,750,086 | 6/1988 | Mittal | 361/382 |
| 4,799,543 | 1/1989 | Iversen et al. | 165/135 |
| 4,823,863 | 4/1989 | Nakajima et al. | 165/80.4 |
| 4,866,570 | 9/1989 | Porter | 361/382 |
| 4,870,477 | 9/1989 | Nakanishi et al. | 357/82 |
| 4,920,574 | 4/1990 | Yamamoto et al. | 361/385 |
| 4,928,206 | 5/1990 | Porter et al. | 361/385 |
| 5,000,256 | 3/1991 | Tousignant | 165/46 |
| 5,212,626 | 5/1993 | Bell et al. | 361/385 |
| 5,216,580 | 6/1993 | Davidson et al. | 361/385 |
| 5,263,536 | 11/1993 | Hulburd et al. | 165/80.4 |

FOREIGN PATENT DOCUMENTS 7204156 12/1982 Japan ..................... 257/715

*Primary Examiner*—Gregory D. Thompson
*Attorney, Agent, or Firm*—Paul J. Maginot

[57] ABSTRACT

An apparatus for cooling an integrated circuit device includes a container defining a chamber that is partially filled with a coolant which forms a coolant pool in the chamber, wherein heat generated by the integrated circuit device causes boiling of the coolant at a heating area of the coolant pool so that vaporized coolant rises upwardly from the coolant pool and condenses on a ceiling of the chamber forming coolant droplets thereon. The apparatus further includes a baffle positioned within the chamber and at least partially out of the coolant pool, the baffle further being positioned within a path traveled by the coolant droplets falling from the ceiling due to gravity, wherein the baffle is configured to guide the coolant droplets away from the heating area of the coolant pool as the coolant droplets fall from the ceiling towards the coolant pool due to gravity.

11 Claims, 3 Drawing Sheets

INTEGRATED CIRCUIT COOLING DEVICE HAVING INTERNAL BAFFLE

CROSS REFERENCE

Cross reference is made to co-pending U.S. patent application Ser. No. 08/274,947, entitled "Cooling Device for an Integrated Circuit having Internal Cooling Conduit" by Robert W. Paterson which is assigned to the same assignee as the present invention, and filed concurrently herewith.

BACKGROUND OF THE INVENTION

The present invention relates generally to dissipation of heat generated by electronic components, and more particularly to an apparatus for cooling an integrated circuit device.

Cooling of certain integrated circuit devices are necessary to ensure their proper operation and useful life. Also, cooling provides for enhanced performance of such integrated circuit devices.

Various designs for apparatus which cool integrated circuit devices have been developed. Such devices include mechanisms which circulate coolants such as air, water and fluorocarbons through the housings in which they are contained.

One example of such a design is U.S. Pat. No. 4,572,286 which discloses a boiling cooling apparatus that includes a heat generating device which is completely immersed in a liquid coolant which partially fills a sealed container. At least one vertically extending passage is provided through the heat producing device whereby ascending bubbles formed in the passage by the heat transfer from the heat generating device to the liquid medium cause an upward current flow through the passage. A plurality of current flow control plates are provided for diverting the upward flow of liquid coolant laterally and downwardly along the sides of the container to provide convection cooling and directing the downward flow of the liquid coolant into the lower end of the passage in the heat generating device to provide a cyclic flow of the cooling liquid.

Another example is U.S. Pat. No. 4,698,728 which describes a liquid cooling system that includes a frame holding a plurality of printed circuit boards, each of which has electrical components attached thereto. The system further includes a top reservoir for holding a liquid at atmospheric pressure, a conduit for conveying the liquid in a downward direction from the top reservoir over the components, a bottom reservoir for receiving the liquid plus any air due to leaks from the conduit, a pump for sucking the liquid and air through the conduit at subatmospheric pressures and for returning the liquid to the top reservoir.

Yet another example is U.S. Pat. No. 5,216,580 which discloses an optimized integral heat pipe and electronic circuit module arrangement. A ceramic multi-chip module bearing electronic circuit components has applied to the side opposite the electronic circuit components preparatory metallization and a thermal wick. A heat pipe evaporator chamber and condenser assembly is attached to the multi-chip module and wick assembly. A suitable working fluid is introduced into the vapor chamber and the vapor chamber hermetically sealed. Application of the thermal wick to the heat producing multi-chip module eliminates the thermal impedance contributed by the thermal transmission media, permitting a doubling of heat flux from the multi-chip module to the heat pipe evaporator.

Some prior art devices may allow areas of the liquid coolant contained in the cooling device housing to stagnate thereby reducing the effectiveness of the heat transfer process. This is especially true for passive devices that cool integrated circuit chips (i.e. devices which do not utilize an electric pump or motor to circulate the coolant through the housing). Also, some prior art devices are relatively inefficient at transferring heat away from the integrated circuit device due to their overall configuration and design.

It would be desirable to provide an apparatus for cooling an integrated circuit device that is passive (i.e. no electric pump or motor) and which does not allow significant stagnation of the liquid coolant in the cooling device housing. It would also be desirable to provide an apparatus for cooling an integrated circuit device that efficiently transfers heat away from the integrated circuit device. It would further be desirable if such cooling apparatus was easy to assemble and inexpensive to manufacture.

SUMMARY OF THE INVENTION

In accordance with one embodiment of the present invention, there is provided an apparatus for cooling an integrated circuit device. The apparatus includes a container defining a chamber that is partially filled with a coolant which forms a coolant pool in the chamber, wherein heat generated by the integrated circuit device causes boiling of the coolant at a heating area of the coolant pool so that vaporized coolant rises upwardly from the coolant pool and condenses on a ceiling of the chamber forming coolant droplets thereon. The apparatus further includes a baffle positioned within the chamber and at least partially out of the coolant pool, the baffle further being positioned within a path traveled by the coolant droplets falling from the ceiling due to gravity, wherein the baffle is configured to guide the coolant droplets away from the heating area of the coolant pool as the coolant droplets fall from the ceiling towards the coolant pool due to gravity.

Pursuant to another embodiment of the present invention, there is provided a method of cooling an integrated circuit device. The method includes the steps of (1) providing a container which defines a chamber; (2) partially filling the container with a coolant so as to form a coolant pool in the chamber; (3) generating heat by the integrated circuit device so as to boil the coolant at a heating area of the coolant pool so that vaporized coolant rises upwardly from the coolant pool and condenses on a ceiling of the chamber forming coolant droplets thereon; (4) positioning a baffle (a) within the chamber, (b) at least partially out of the coolant pool, and (c) within a path defined by the coolant droplets falling from the ceiling due to gravity; and (5) guiding coolant droplets away from the heating area of the coolant pool with the baffle as the coolant droplets fall from the ceiling due to gravity.

It is therefore an object of the present invention to provide a new and useful apparatus for cooling an integrated circuit device.

It is a further object of the present invention to provide an improved apparatus for cooling an integrated circuit device.

It is another object of the present invention to provide a new and useful method of cooling an integrated circuit device.

It is moreover an object of the present invention to provide an improved method of cooling an integrated circuit device.

It is still another object of the present invention to provide an apparatus for cooling an integrated circuit device which is relatively efficient at transferring heat away from the integrated circuit device.

It is moreover another object of the present invention to provide a method for cooling an integrated circuit device which is relatively efficient at transferring heat away from the integrated circuit device.

It is yet another object of the present invention to provide an apparatus for cooling an integrated circuit device that is passive (i.e. no electric motor or pump) and which reduces stagnation of the liquid coolant contained in the cooling device housing.

It is still another object of the present invention to provide a method of cooling an integrated circuit device which reduces stagnation of the liquid coolant contained in the cooling device housing without the use of electric pumps or motors.

The above and other objects, features, and advantages of the present invention will become apparent from the following description and the attached drawings.

DETAILED DESCRIPTION OF THE PREFERRED EMBODIMENT

Figure 1:
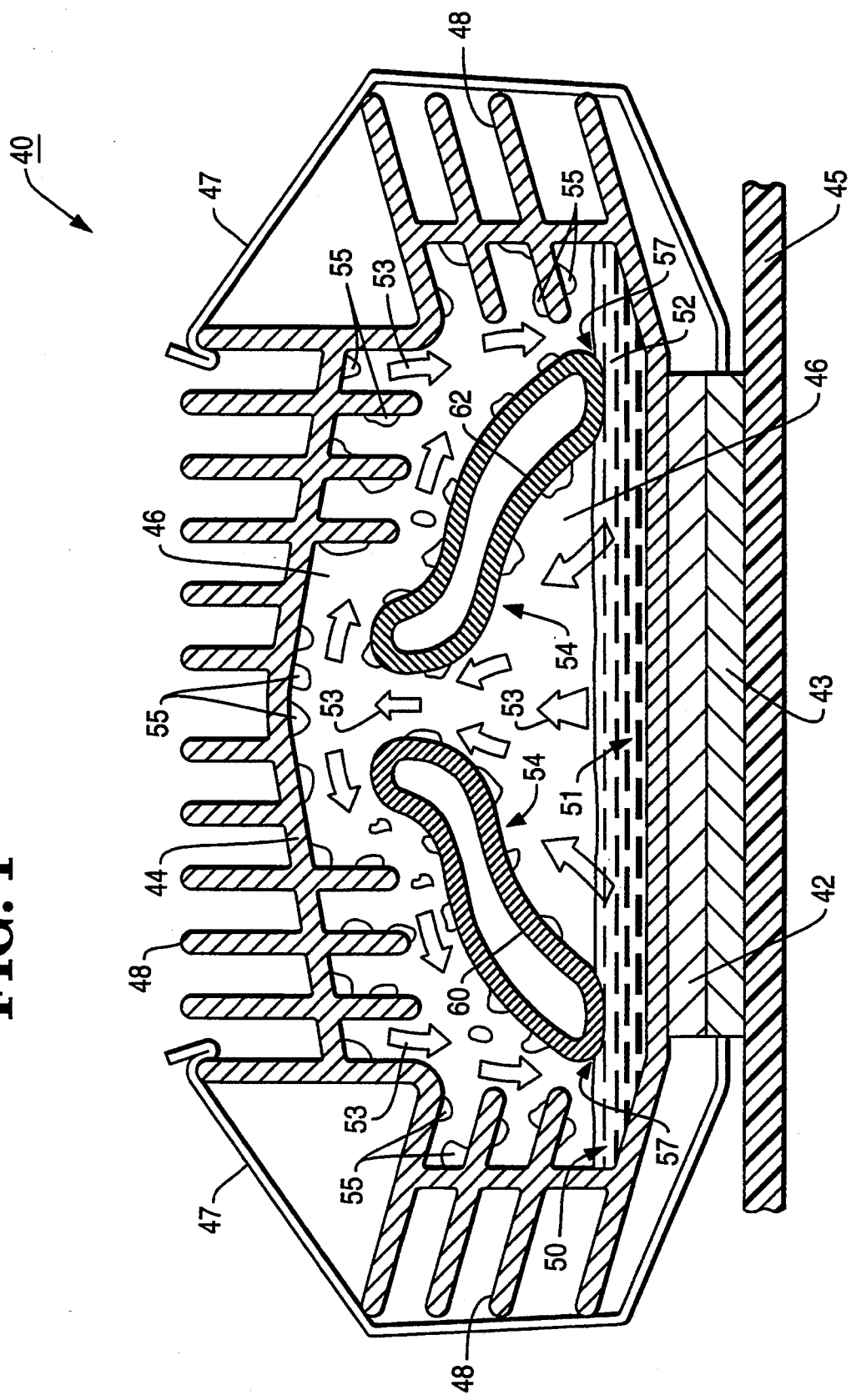
FIG. 1 is a sectional view taken in the direction of the arrows 1—1 of FIG. 3 showing an apparatus for cooling an integrated circuit device that incorporates the features of the present invention therein.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 2:
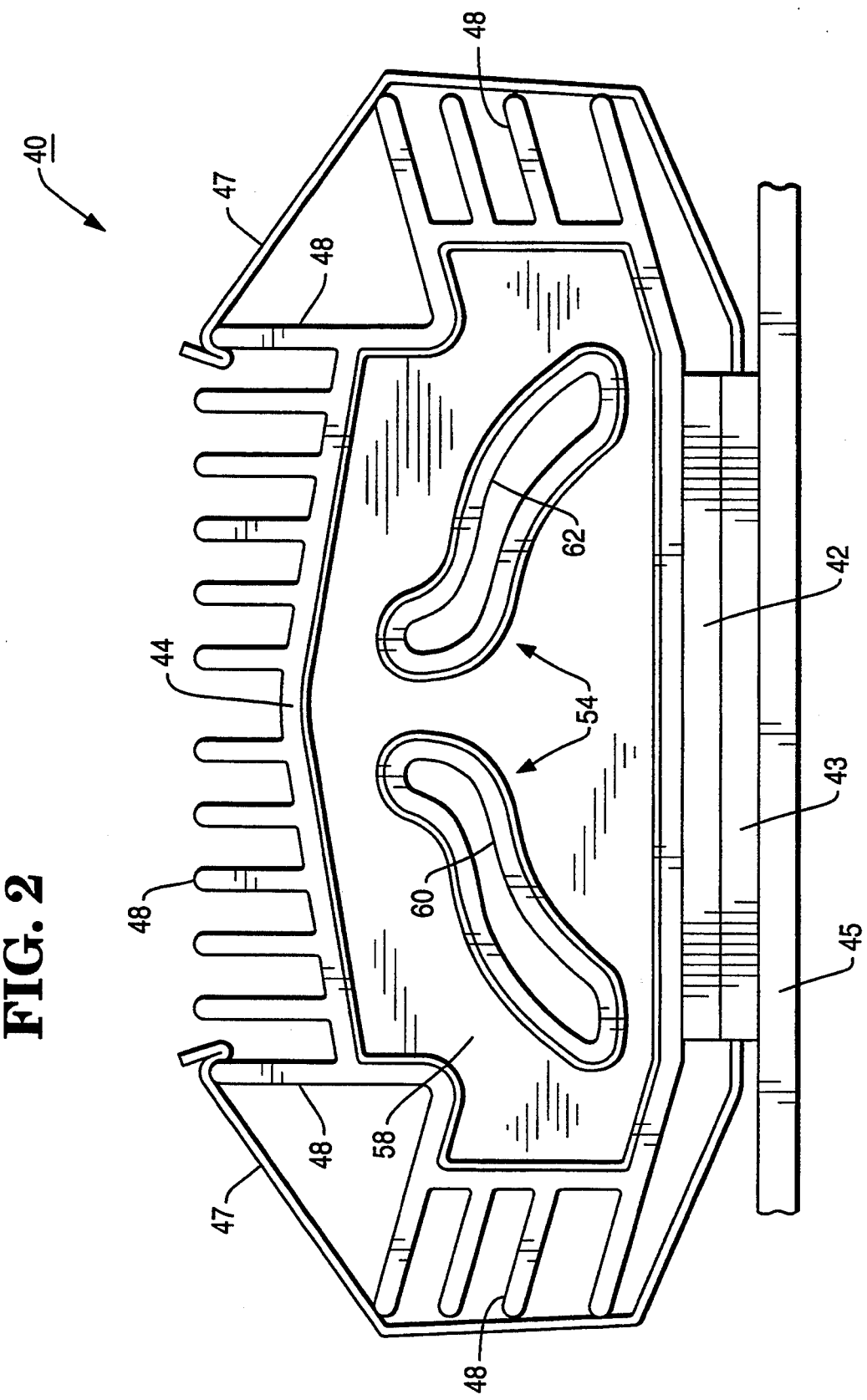
FIG. 2 is a side elevational view of the apparatus for cooling an integrated circuit device taken in the direction of the arrows 2—2 of FIG. 3.
Figure 3:
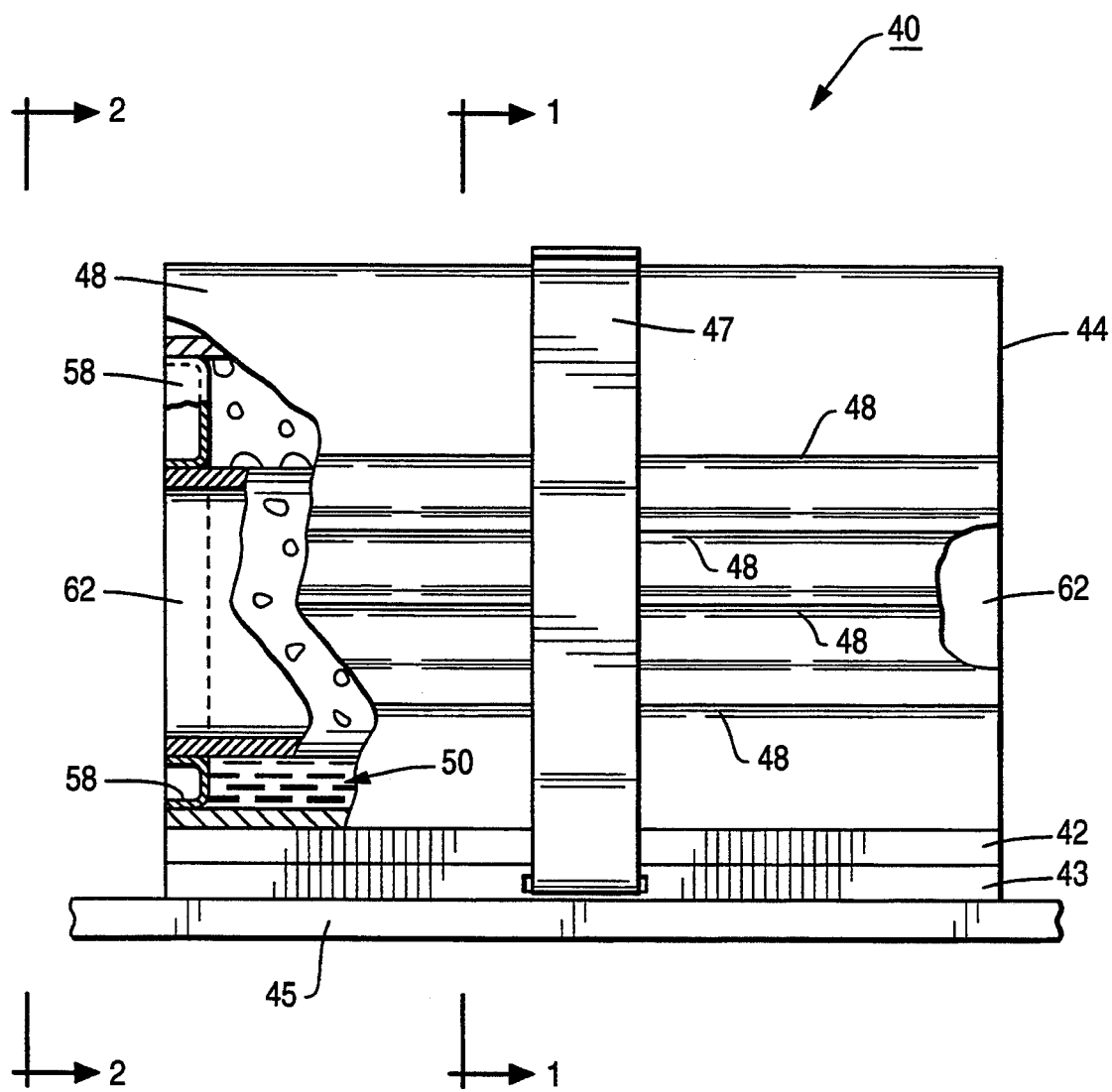
FIG. 3 is a front elevational view of the apparatus for cooling an integrated circuit device of FIG. 1, with a portion of the container of the apparatus shown removed for clarity of description.

Referring now to FIGS. 1-3, there is shown an apparatus 40 for cooling an integrated circuit 42 such as a Pentium integrated circuit device available from Intel Corporation of Santa Clara, Calif.

A chip socket 43 is secured to a printed circuit board 45 as shown in FIGS. 1-3. The printed circuit board 45 has positioned thereon numerous electrical circuits (not shown). The integrated circuit device 42 is plugged into the chip socket 43 so as to connect the integrated circuit device to the electrical circuits on the printed circuit board. The chip socket 43 includes a pair of clips 47 which secure the cooling apparatus 40 at a location adjacent to the integrated circuit device 42.

The cooling apparatus 40 is positioned in contact with the integrated circuit device 42 as shown in FIGS. 1-3. Since the bottom of the cooling device and the top of the integrated circuit device 42 may each be microscopically uneven so that these two surfaces are not positioned entirely flush against each other, a conductive paste is interposed between these two surfaces to enhance heat transfer. A conductive paste which may be used is a metal oxide filled, silicone-free synthetic grease. For example, one metal oxide filled, silicone-free synthetic grease which may be used is Sil-Free 1020, a trademark of Aavid Engineering, Inc. of Laconia, N.H.

The cooling apparatus 40 includes a container 44 defining a chamber 46. The container 44 is extruded from an aluminum material. The container 44 has a plurality of fins 48 extending therefrom.

The chamber 46 is partially filled with a coolant 50 which forms a coolant pool 52 in the chamber as shown in FIG. 1. The coolant 50 is a non-electrically conductive liquid. For example, the coolant 50 may be a non-electrically conductive fluorinated liquid such as Fluourinert, a trademark of Minnesota Mining and Manufacturing Company of St. Paul, Minn. If the cooling apparatus 40 were to crack thereby leaking the coolant 50 onto the printed circuit board, the circuits on the printed circuit board would not be short circuited since the coolant 50 is non-electrically conductive.

During its operation, the integrated circuit device 42 produces heat which causes boiling of the coolant 50 at a heating area 51 in the coolant pool 52. The heating area 51 of the coolant pool 52 is defined by the area of the coolant pool which has the highest temperature within the coolant pool. In particular, the heating area 51 of the coolant pool 52 would be an area of the coolant pool which is closest in distance to the integrated circuit device 42 as shown in FIG. 1.

As the coolant 50 boils, vaporized coolant, schematically shown as arrows 53 in FIG. 1, rises upwardly from the coolant pool towards a ceiling of the chamber 46. Upon reaching the ceiling of the chamber, the vaporized coolant 53 condenses thus forming coolant droplets 55 thereon. Thereafter, the coolant droplets 55 fall downwardly from the ceiling due to gravity.

The cooling apparatus 40 further includes a cooling conduit 54 positioned within the chamber 16. The cooling conduit 54 includes a first conduit segment 60 and a second conduit segment 62. The conduit segments 60 and 62 are positioned partially out of the coolant pool 52 as shown in FIG. 1. Moreover, the conduit segments 60 and 62 are positioned in a first path traveled by the vaporized coolant 53 as it rises upwardly from the coolant pool towards the ceiling. As a result, coolant droplets form on the conduit segments 60 and 62 as the vaporized coolant travels upwardly in the chamber 46. In addition, the conduit segments 60 and 62 are positioned in a second path traveled by the coolant droplets 55 as they fall downwardly from the ceiling due to gravity.

Each of the conduit segments 60 and 62 is extruded into an elongated member having a central channel extending therethrough. Each of the conduit segments has an orifice on each side of thereof. The conduit segments 60 and 62 are extruded from an aluminum material. As configured, each of the conduit segments 60 and 62 defines a passageway though which ambient air (from outside the chamber 46) may pass.

The cooling apparatus 40 further includes a first end cap 58 (see FIGS. 2 and 3) and a second end cap (not shown) which is friction fit between the container 44 and the cooling segments 60 and 62. A glue is applied between each end cap and the container 44, and each end cap and the conduit segments 60 and 62 so as to provide a liquid tight seal. The first and second end caps support the conduit segments 60 and 62 within the cooling apparatus 40. The first and second end caps are stamped into shape from an aluminum material. Each of the end caps has two openings defined therein. When the end caps are secured to the conduit segments 60 and 62, the two openings of each end cap aligns with two respective orifices of the two conduit segments. What is meant herein by the term "align" is that an opening of an end cap and an orifice of a conduit segment overlaps (i.e. aligns) to some extent so as to allow a fluid, such as air, to advance through the opening and the orifice when the end cap is secured to the conduit segment. (See e.g. FIG. 3 which partially shows the alignment of one opening of end cap 58 with an orifice of conduit segment 62.)

During operation of the integrated circuit device 42, heat is produced so that the coolant 50 in the coolant pool 52 boils. This causes vaporized coolant 53 to rise upwardly from the coolant pool and contact the conduit segments 60 and 62. Some of the vaporized coolant 53 condenses on the conduit segments 60 and 62 thereby forming coolant droplets thereon. The rest of the vaporized coolant 53 continues to rise until it reaches the ceiling of the chamber 46 thereby forming coolant droplets 55 thereon. As the coolant droplets 55 continue to form on the ceiling, they begin to fall downwardly onto the conduit segments 60 and 62 due to gravity. The coolant droplets then run downwardly over the surface of the conduit segments 60 and 62 until they eventually enter the coolant pool 52 at a return area 57 of the coolant pool as shown in FIG. 1. It is important to note that the return area 57 of the coolant pool is remote from the heating area 51 of the coolant pool. It is further important to note that each of the conduit segments 60 and 62 functions as a baffle to guide the coolant droplets 55 away from the heating area 51 of the coolant pool 52 as the coolant droplets fall from the ceiling toward the coolant pool due to gravity.

As heat is generated by the integrated circuit device 42, it is transferred to the base of the container 44 and then to the coolant 50 in the coolant pool 52. As the coolant 50 boils, the vaporized coolant 53 rises upwardly in the container so as to contact the conduit segments 60 and 62. Some of the heat is then transferred to the conduit segments and then to the ambient air which is located within the passageways of the conduit segments 60 and 62. As ambient air advances through the conduit segments, the heat moves out of the passageways and is thereafter dissipated into the ambient surroundings.

As the remainder of the coolant vapor 53 continues to rise, it eventually contacts the ceiling of the chamber 46. Some of the heat is then transferred through the wall of the container 44 to the outside of the cooling apparatus 40 so as to be dissipated into the ambient surroundings.

As the coolant droplets 55 form on the ceiling of the chamber 46, they begin to drop downwardly due to gravity thereby contacting the conduit segments 60 and 62. The coolant droplets then run downwardly over the surface of the conduit segments 60 and 62. Some of the heat contained in these coolant droplets is transferred to the conduit segments and then to the ambient surroundings as described above. Thereafter, the coolant droplets enter the coolant pool 52 at the return area 57 as shown in FIG. 1. The above-described cycle is then repeated so as to further cool the integrated circuit device 42.

While the invention has been illustrated and described in detail in the drawings and foregoing description, such illustration and description is to be considered as exemplary and not restrictive in character, it being understood that only the preferred embodiments have been shown and described and that all changes and modifications that come within the spirit of the invention are desired to be protected.

What is claimed is:

1. An apparatus for cooling an integrated circuit device, comprising:

a container defining a chamber that is partially filled with a coolant which forms a coolant pool in the chamber, wherein heat generated by the integrated circuit device causes boiling of the coolant at a heating area of the coolant pool so that vaporized coolant rises upwardly from the coolant pool and condenses on a ceiling of the chamber forming coolant droplets thereon; and a baffle positioned within the chamber and at least partially out of the coolant pool, said baffle further being positioned within a path traveled by the coolant droplets falling from the ceiling due to gravity, wherein said baffle is configured to guide the coolant droplets away from the heating area of the coolant pool as the coolant droplets fall from the ceiling towards the coolant pool due to gravity.

2. The apparatus of claim 1, wherein:

said container has a first opening and a second opening defined therein; and said baffle is secured to said container and defines a conduit having a first orifice and a second orifice, wherein the first opening is aligned with the first orifice and the second opening is aligned with the second orifice, wherein ambient air located outside of the chamber is able to pass through the conduit defined by said baffle.

3. The apparatus of claim 2, wherein said baffle is positioned in a path traveled by vaporized coolant rising from the coolant pool towards the ceiling.

4. The apparatus of claim 1, wherein said baffle includes:

a first baffle segment attached to said container; and
a second baffle segment attached to said container.

5. The apparatus of claim 4, wherein:

said container has defined therein a first opening, a second opening, a third opening, and a fourth opening;

said first baffle segment is secured to said container and defines a first conduit having a first orifice and a second orifice, wherein the first opening is aligned with the first orifice and the second opening is aligned with the second orifice; and said second baffle segment is secured to said container and defines a second conduit having a third orifice and a fourth orifice, wherein the third opening is aligned with the third orifice and the fourth opening is aligned with the fourth orifice, wherein ambient air located outside of the chamber is able to pass through the first baffle segment and the second baffle segment.

6. The apparatus of claim 5, wherein the first baffle segment and the second baffle segment are each positioned in the path traveled by vaporized coolant rising from the coolant pool towards the ceiling.

7. The apparatus of claim 1, wherein said baffle is configured to guide the coolant droplets to a return area of the coolant pool which is remote from the heating area of the coolant pool.

8. The apparatus of claim 1, wherein the coolant is a non-electrically conductive liquid.

9. A method of cooling an integrated circuit device, comprising the steps of:
- providing a container which defines a chamber;
- partially filling the container with a coolant so as to form a coolant pool in the chamber;
- generating heat by the integrated circuit device so as to boil the coolant at a heating area of the coolant pool so that vaporized coolant rises upwardly from the coolant pool and condenses on a ceiling of the chamber forming coolant droplets thereon;
- positioning a baffle (1) within the chamber, (2) at least partially out of the coolant pool, and (3) within a path defined by the coolant droplets falling from the ceiling due to gravity; and
- guiding coolant droplets away from the heating area of the coolant pool with the baffle as the coolant droplets fall from the ceiling towards the coolant pool due to gravity.

10. The method of claim 9, wherein said guiding step further includes the step of guiding the coolant droplets with the baffle to a return area of the coolant pool which is remote from the heating area of the coolant pool.

11. The method of claim 10, further comprising the step of advancing coolant from the return area of the coolant pool to the heating area of the coolant pool.

* * * * *